United States Patent
Chen (10) Patent No.: US 7,358,482 B2
(45) Date of Patent: Apr. 15, 2008

(54) PACKAGING STRUCTURE OF A LIGHT-SENSING ELEMENT AND FABRICATION METHOD THEREOF

(75) Inventor: Po-Hung Chen, Shin-Chu (TW)

(73) Assignee: Sigurd Microelectronics Corp., Shin-Chu (TW)

( * ) Notice: Subject to any disclaimer, the term of this patent is extended or adjusted under 35 U.S.C. 154(b) by 120 days.

(21) Appl. No.: 11/231,842

(22) Filed: Sep. 22, 2005

(65) Prior Publication Data
US 2006/0243896 A1  Nov. 2, 2006

(30) Foreign Application Priority Data
Apr. 29, 2005  (TW) ............... 94114014 A (51) Int. Cl.
*H01L 27/14* (2006.01)
(52) U.S. Cl. .................. 250/239; 257/434
(58) Field of Classification Search ........ 250/239; 257/431–434
See application file for complete search history.

(56) References Cited

U.S. PATENT DOCUMENTS

| | | | |
|---|---|---|---|
| 5,569,390 A * | 10/1996 | Endo ............... 250/208.1 |
| 6,483,030 B1 * | 11/2002 | Glenn et al. ........ 174/521 |
| 6,483,101 B1 * | 11/2002 | Webster ............. 250/216 |
| 6,686,588 B1 * | 2/2004 | Webster et al. ....... 250/239 |
| 6,724,061 B2 * | 4/2004 | Murata ............... 257/433 |
| 2002/0060287 A1 * | 5/2002 | Ho et al. ............ 250/239 |
| 2003/0066955 A1 * | 4/2003 | Schaub et al. ........ 250/239 |

FOREIGN PATENT DOCUMENTS

JP  59150451 A * 8/1984

* cited by examiner

*Primary Examiner*—Georgia Epps
*Assistant Examiner*—Stephen Yam
(74) *Attorney, Agent, or Firm*—Rosenberg, Klein & Lee (57) ABSTRACT

The present invention discloses a packaging structure of a light-sensing element and a fabrication method thereof, wherein the light-sensing chip is installed on the substrate, and then a cleaning step is undertaken; next, a light transparent cover with a cavity is installed to the substrate with a glue material in order to envelop the light-sensing chip. Thereby, the present invention not only can clean pollutants completely and promote the yield, but also can reduce the packaging area. In the present invention, the engagement portions may also be formed on the substrate and the light transparent cover so that the alignment can be undertaken easily.

5 Claims, 10 Drawing Sheets

PACKAGING STRUCTURE OF A LIGHT-SENSING ELEMENT AND FABRICATION METHOD THEREOF

BACKGROUND OF THE INVENTION

1. Field of the Invention

The present invention relates to a packaging technology of a light-sensing element, particularly to a packaging structure of a light-sensing element and a fabrication method thereof, which can protect the light-sensing chip from the pollution by external particles.

2. Description of the Related Art

A CMOS light-sensing element is an element fabricated according to the principle of optoelectronics and is extensively used in the image-related field, such as security cameras, digital cameras, toys, mobile phones, PDA's, video phones, fingerprint identifiers, etc.

Figure 1A:
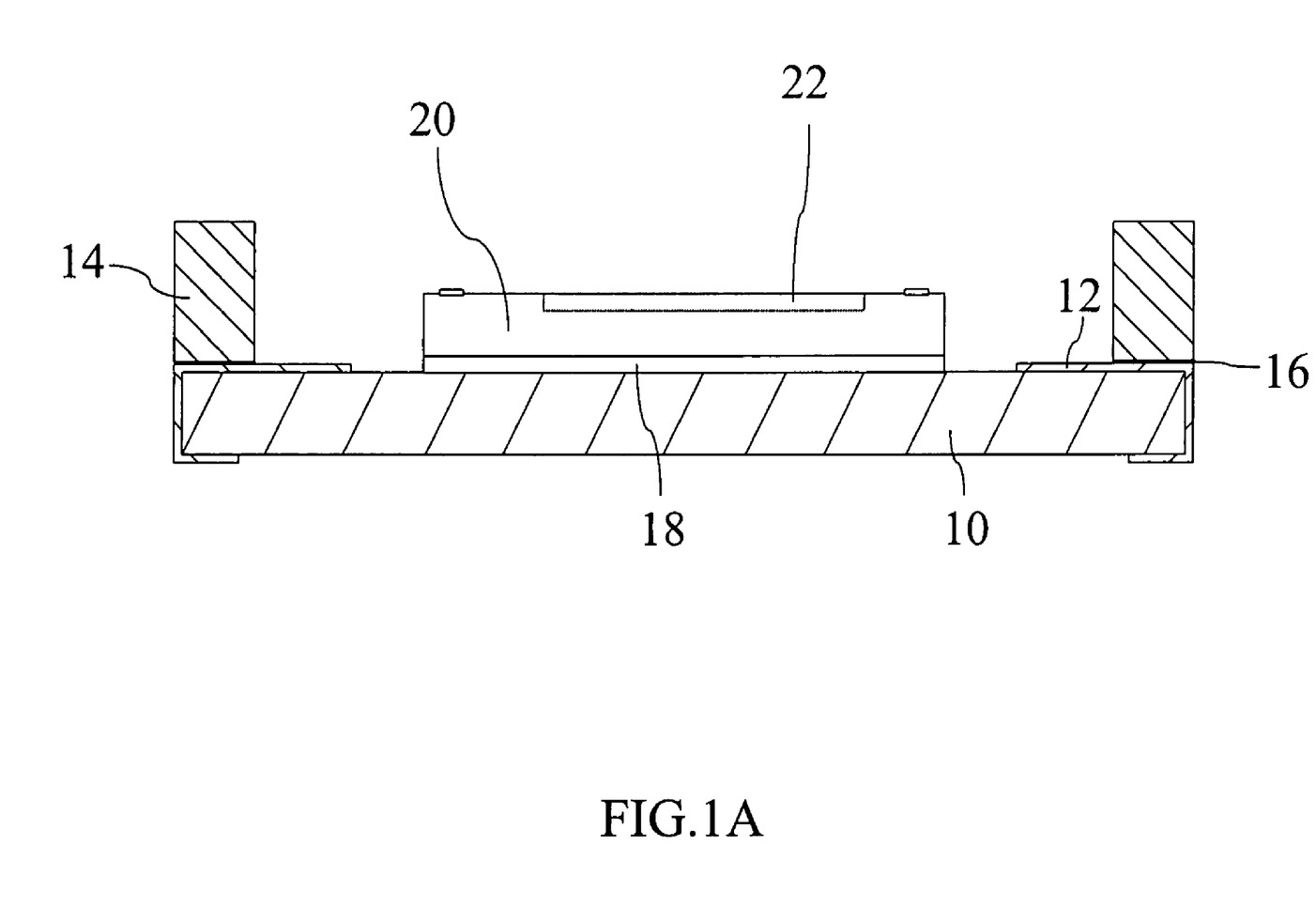
FIG. 1A to FIG. 1C are section views showing the steps of the conventional fabrication method of a CMOS light-sensing element.
Figure 1B:
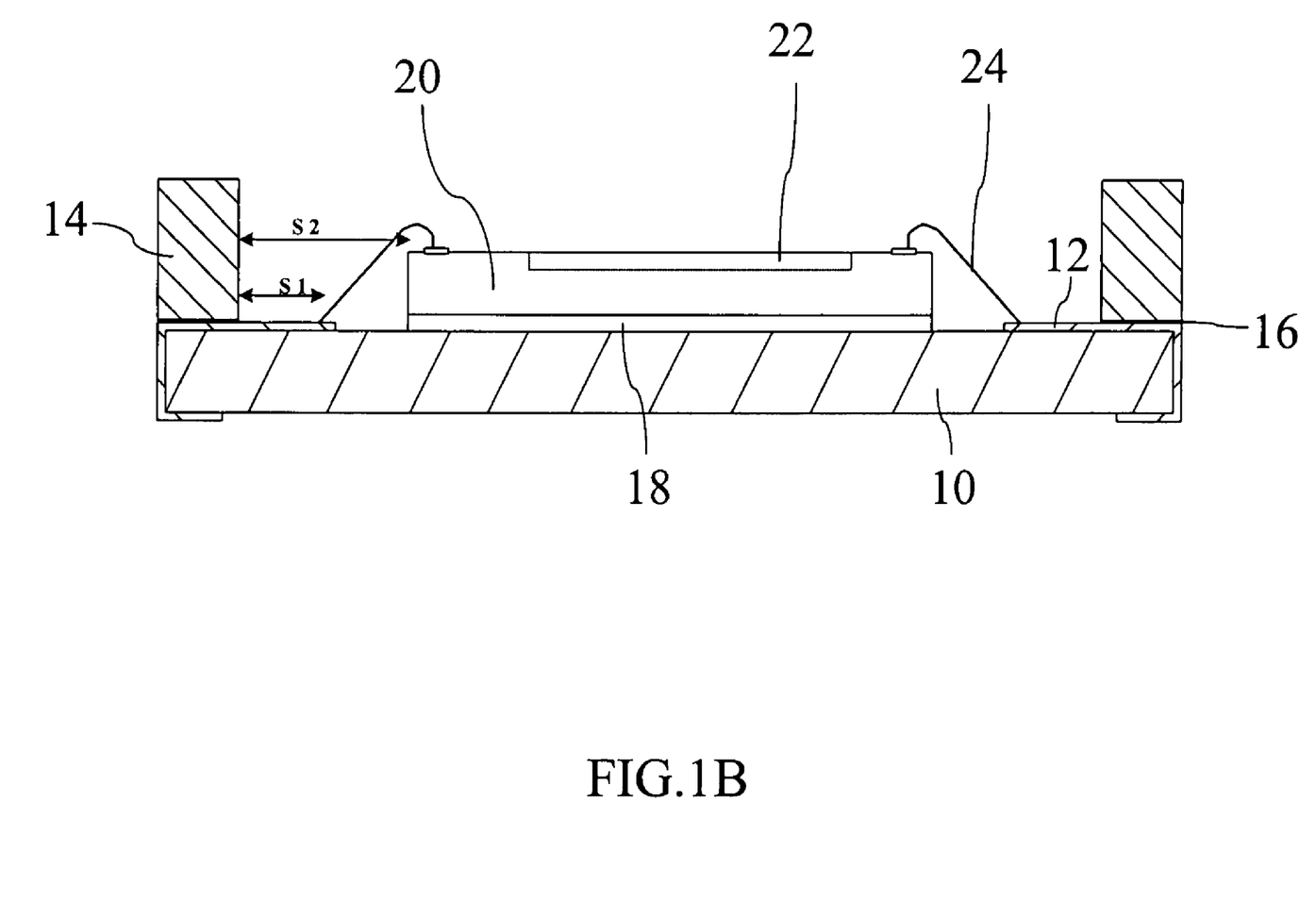
Figure 1C:
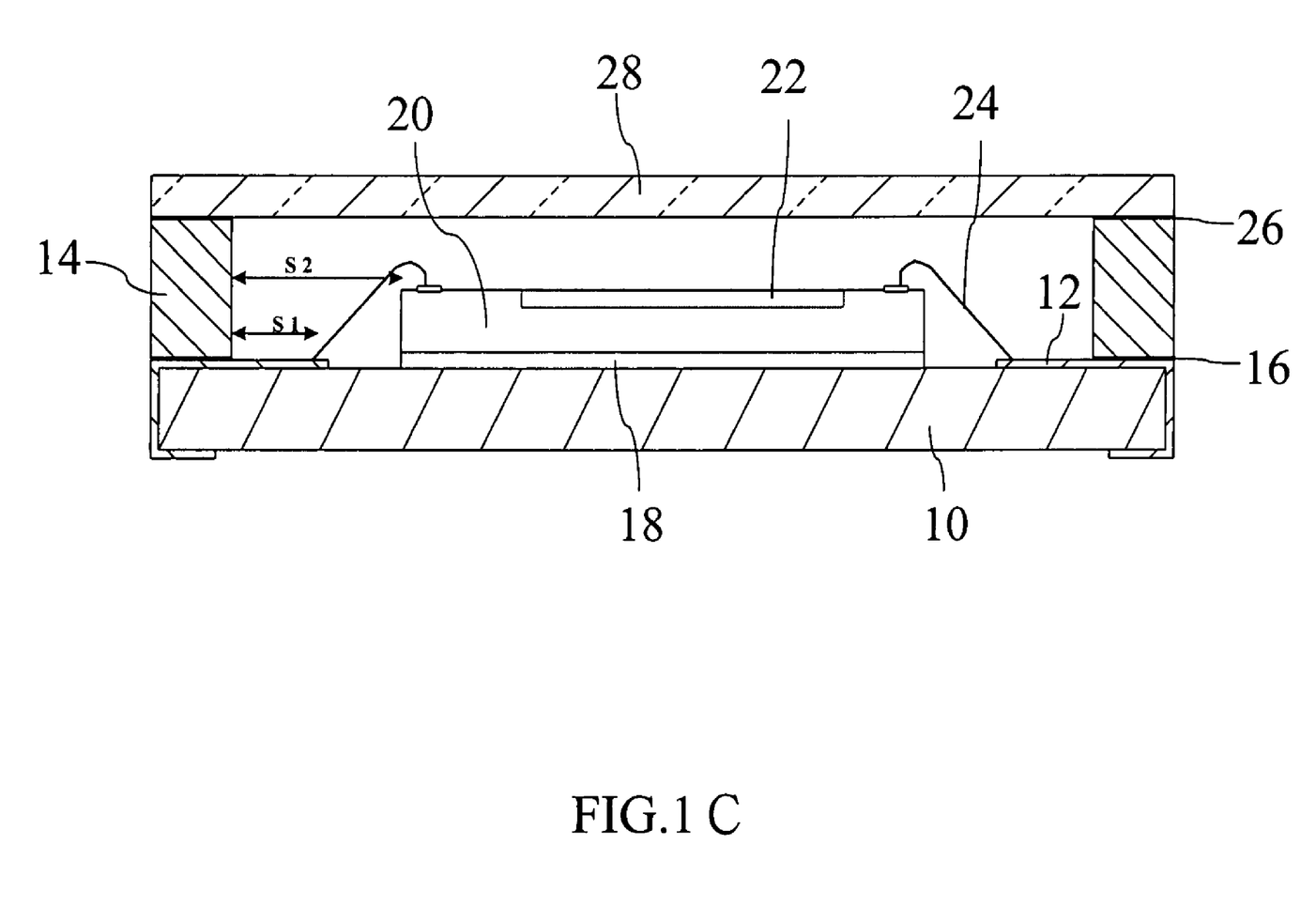

Refer to from FIG. 1A to FIG. 1C for the steps of the conventional fabrication method of a CMOS light-sensing element. Firstly, as shown in FIG. 1A, a substrate 10 having metallization traces 12 is provided; a frame 14 is stuck onto the perimeter of the substrate 10 with a first glue layer 16; a light-sensing chip 20 is stuck onto the substrate 10 with an adhesive 18 and positioned inside the frame 14, and the light-sensing chip 20 has a light-sensing region 22. Next, as shown in FIG. 1B, a wire-bonding procedure is undertaken, and multiple bond wires 24 are used to electrically connect the light-sensing chip 20 to the metallization traces 12 of the substrate 10; then, a cleaning procedure is undertaken to remove pollutants. Next, as shown in FIG. 1C, a transparent glass 28 is joined to the frame 14 with a second glue layer 26, and the packaging structure of a light-sensing element shown in FIG. 1C is thus formed. Such a packaging method can retard external pollutants, and the CMOS light-sensing element can truly sense the surroundings thereby.

As the frame 14 has been joined to the substrate 10 before the wire-bonding procedure, a spacing S1 between the frame 14 and the metallization traces 12 is reserved to prevent the capillaries of the bond wires from bumping against the frame 14 in the cleaning procedure. In the cleaning procedure, if the spacing S2 between the frame 14 and the light-sensing chip 20 is too small, it is hard to completely remove pollutants existing between the frame 14 and the light-sensing chip 20; thus, the function of the light-sensing chip 20 is influenced.

Accordingly, the present invention proposes a packaging structure of a light-sensing element and a fabrication method thereof to effectively solve the abovementioned problems.

SUMMARY OF THE INVENTION

The primary objective of the present invention is to provide a packaging structure of a light-sensing element and a fabrication method thereof, which provides a mechanism whereby light can access the light-sensing chip inside the light-sensing element and protects the light-sensing chip from the pollution by external particles.

Another objective of the present invention is to provide a packaging structure of a light-sensing element and a fabrication method thereof, which can decrease the pollutants, promote the yield and reduce the packaging area.

Further objective of the present invention is to provide a simplified fabrication method of a packaging structure of a light-sensing element in order to reduce the fabrication cost.

To achieve the abovementioned objectives, the present invention proposes a packaging structure of a light-sensing element, which comprises: a substrate; a light-sensing chip, stuck onto the substrate, and having a light-sensing region, and electrically connected to the substrate with bond wires; and a light transparent cover, having a cavity, and installed to the substrate, and containing the light-sensing chip inside its cavity, and enveloping the light-sensing chip, in order to retard external pollutants. Besides, the substrate may have at least one first engagement portion, and the light transparent cover may have second engagement portions at the positions corresponding to the first engagement portions. The second engagement portions are engaged with the first engagement portions in order to align the light transparent cover to mate with the substrate.

Further, the present invention proposes a fabrication method of a packaging structure of a light-sensing element to realize the abovementioned packaging structure.

To enable the objectives, technical contents, characteristics, and accomplishments of the present invention to be more easily understood, the embodiments of the present invention are to be described below in detail in cooperation with the attached drawings.

DETAILED DESCRIPTION OF THE INVENTION

The present invention proposes a packaging structure of a light-sensing element and a fabrication method thereof, which provides a mechanism whereby light can access the light-sensing chip inside the light-sensing element and protects the light-sensing chip from the pollution by external particles.

Figure 2:
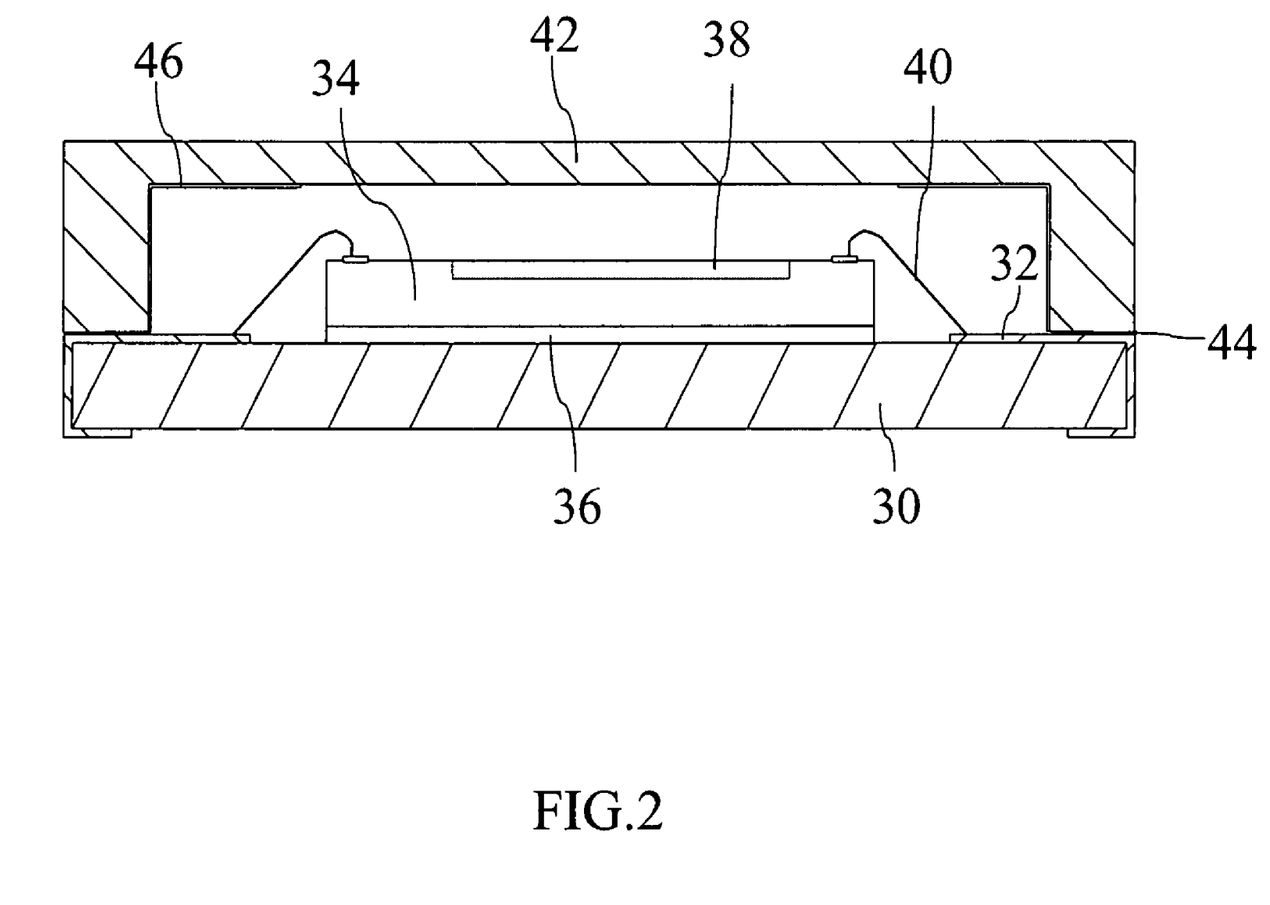
FIG. 2 is a diagram schematically showing the basic packaging structure of a light-sensing element according to the present invention.

As showing FIG. 2, the basic packaging structure of a light-sensing element according to the present invention comprises: a substrate 30, having at least one metallization trace 32; a light-sensing chip 34, stuck onto the substrate 30 with an adhesive layer 36, and having a light-sensing region 38, and electrically connected to the substrate 30 with bond wires 40; and a light transparent cover 42, having a cavity, and stuck to the substrate 30 with a glue material 44, and containing the light-sensing chip 34 inside the cavity, and enveloping the light-sensing chip 34, in order to retard external pollutants. A portion of the light transparent cover 42, which is above the light-sensing region 38 of the light-sensing chip 34, is transparent so that the light-sensing region 38 can truly sense the external environment. Further, a light-shield layer 46 is applied onto the inner wall of the light transparent cover 42, which encircles the perimeter of the light-sensing chip 34, in order to filter out unnecessary light noise coming from the surroundings.

In addition to the basic packaging structure shown in FIG. 2, various embodiments of the present invention may also be derived from this basic packaging structure. For example, the substrate may have at least one first engagement portion, and the light transparent cover may have second engagement portions at the positions corresponding to the first engagement portions. The second engagement portions are engaged with the first engagement portions in order to align the light transparent cover to mate with the substrate. When the first engagement portion is a notch, the second engagement portion will be a protrusion, and when the first engagement portion is a protrusion, the second engagement portion will be a notch, so that both can mate with each other and the light transparent cover can be aligned to the substrate. The packaging structure of a light-sensing element and the fabrication method thereof will be described below in detailed with the preferred embodiment wherein the first engagement portion of the substrate is a notch, and the second engagement portion of the light transparent cover is a protrusion.

Figure 3A:
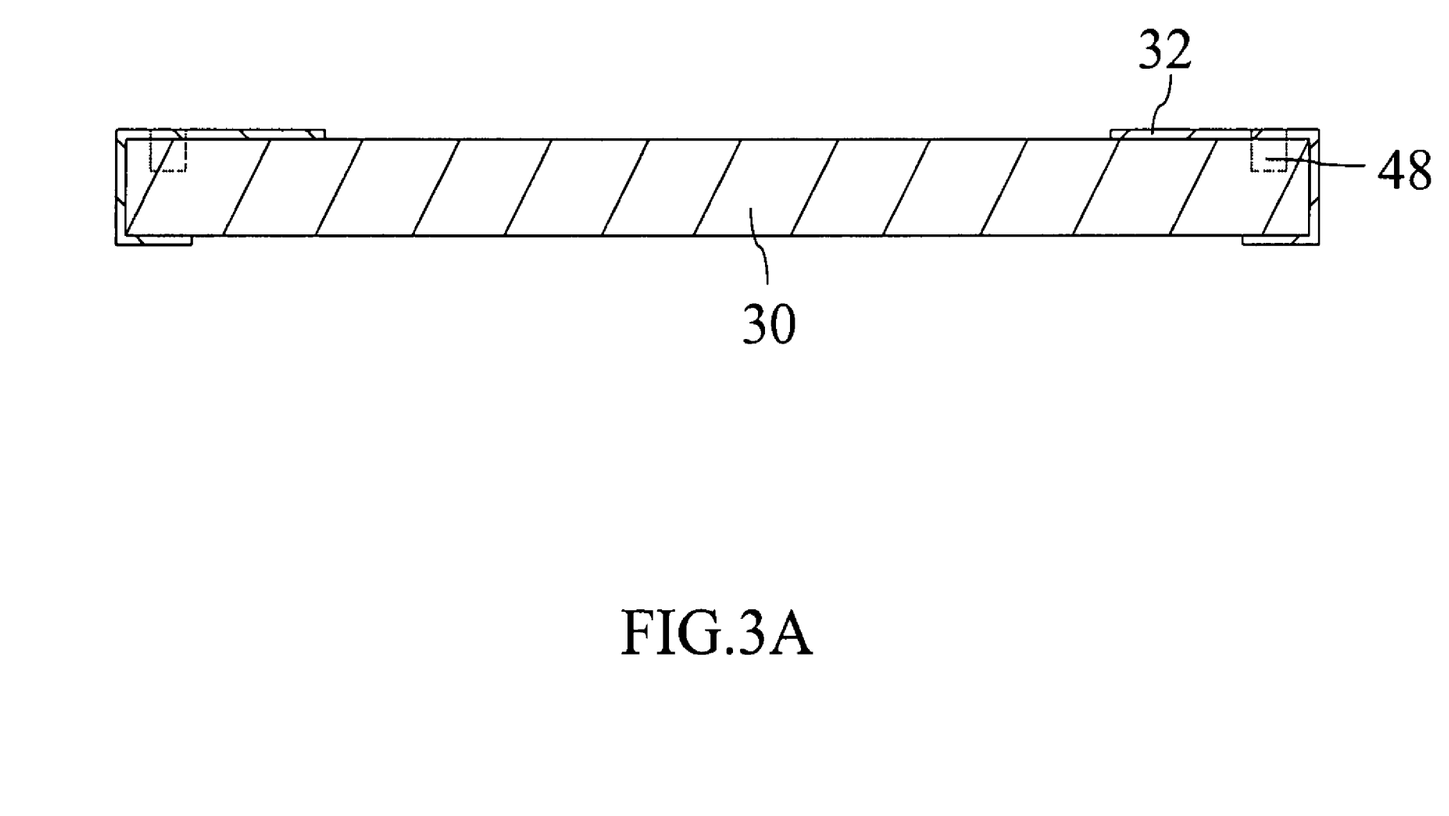
FIG. 3A to FIG. 3D are section views showing the steps of the fabrication method of a packaging structure of a light-sensing element according to the present invention.

Refer to from FIG. 3A to FIG. 3D section views showing the steps of the fabrication method of a packaging structure of a light-sensing element according to the present invention. Firstly, as shown in FIG. 3A, a substrate 30 is provided, and the substrate 30 has multiple notches 48 for alignment; the substrate 30 has at least one metallization trace 32 on its top and bottom surfaces, and the metallization traces 32 on its top and bottom surfaces electrically interconnect each other via plated through-holes (not shown in the drawing); the metallization traces 32 on the substrate 30 comprise at least: a power line, a ground line, a clock signal line, and a data output line, wherein the clock signals of the clock signal line are used in a clock signal interface.

Figure 3B:
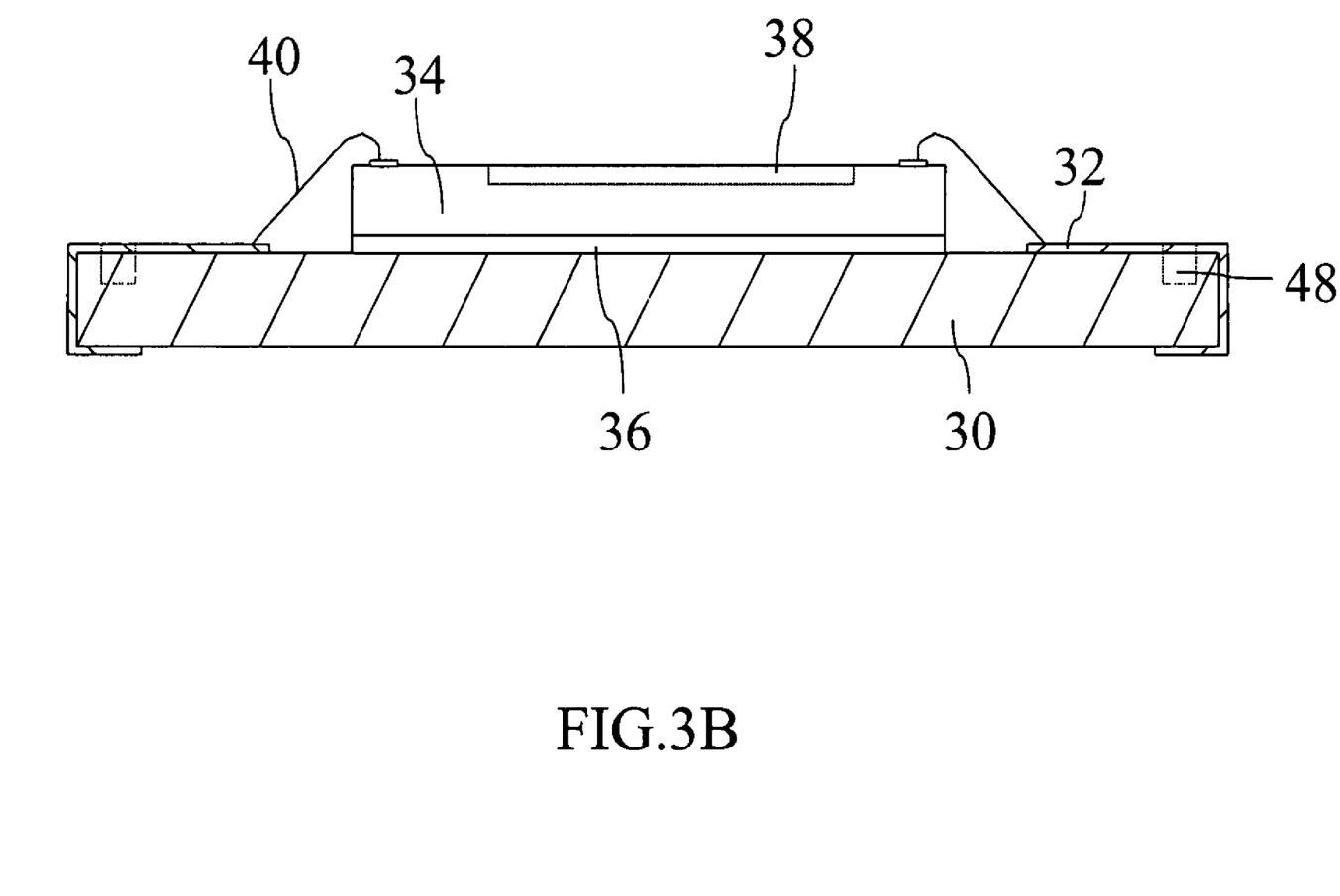

Next, as shown in FIG. 3B, a light-sensing chip 34 is stuck onto the substrate 30 with an adhesive layer 36; the light-sensing chip 34 has a light-sensing region 38; the light-sensing chip 34 is electrically connected to the metallization traces 32 of the substrate 30 with bond wires 40 in a wire-bonding procedure so that the substrate 30 and the light-sensing chip 34 can electrically communicate with each other with the bond wires 40; after completing the wire-bonding procedure, the substrate 30 is cleaned to remove pollutants.

Figure 3C:
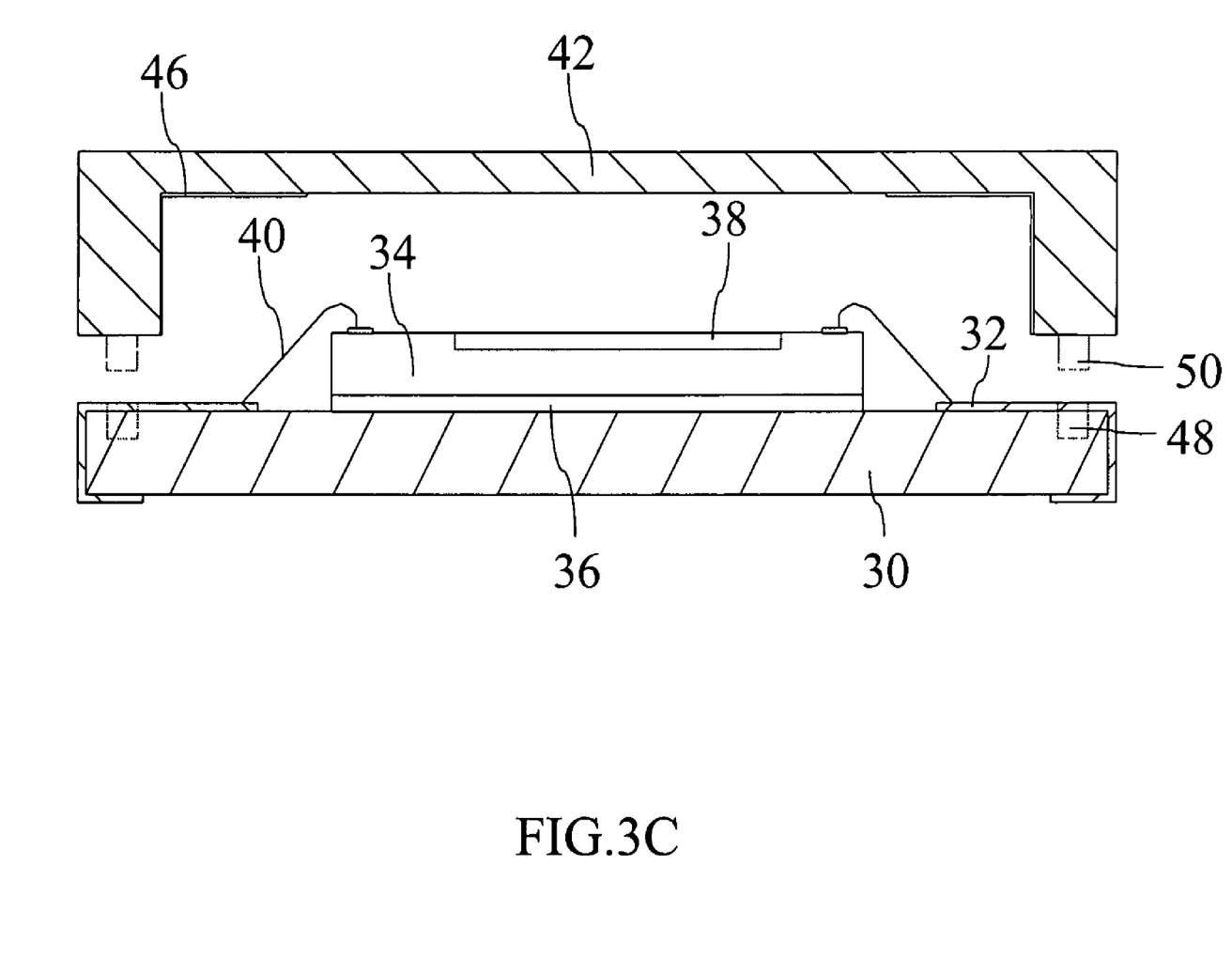
Figure 3D:
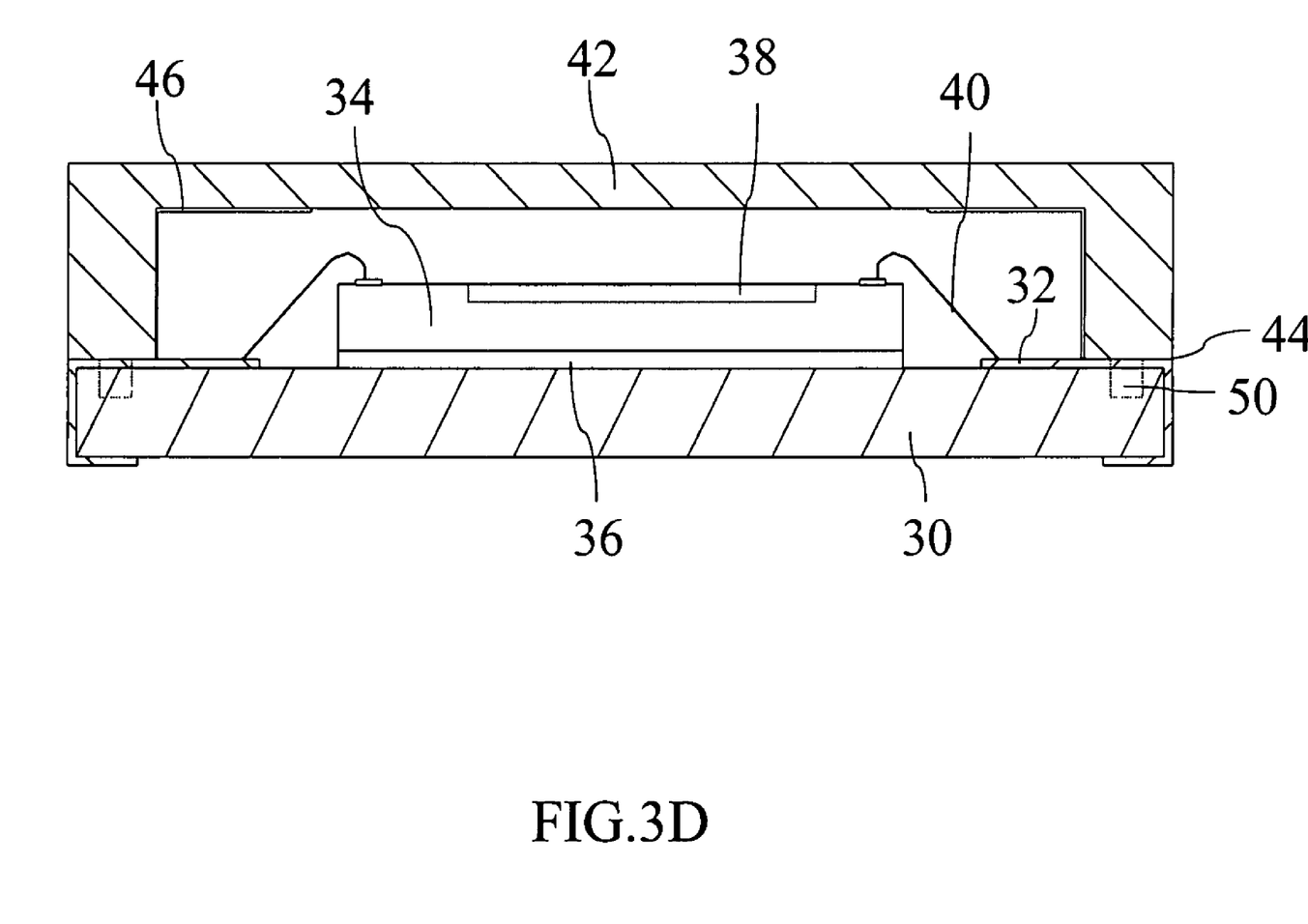

Next, as shown in FIG. 3C, a light transparent cover 42 is provided; the light transparent cover 42 has a cavity and multiple protrusions 50 at the positions corresponding to the notches 48 on the substrate 30. When the light transparent cover 42 is installed to the substrate 30 with a glue material 44, the protrusions 50 of the light transparent cover 42 will mate with the notches 48 of the substrate 30 to align the light transparent cover 42 to the substrate 30. Thereby, the alignment is simplified, and the packaging structure shown in FIG. 3D is completed. Then, the light-sensing chip 34 is contained inside the cavity and enveloped by the light transparent cover 42, and external pollutants are retarded. A portion of the light transparent cover 42, which is above the light-sensing region 38 of the light-sensing chip 34, is transparent so that the light-sensing region 38 can truly sense the external environment. Herein, as the light transparent cover 42 has a cavity, it can directly hood the light-sensing chip 34. A light-shield layer 46 is applied onto the inner wall of the light transparent cover 42 in order to filter out unnecessary light noise coming from the surroundings. As it is the inner wall of the light transparent cover 42 that the light-shield layer 46 is applied onto, the glue material 44 used to join together the light transparent cover 42 and the substrate 30 may be a UV glue, which can be hardened with an ultraviolet ray, so that the temperature of hardening the glue material 44 can be lowered.

Next, as shown in FIG. 3D, as the light transparent cover 42 has a transparent portion, light can effectively penetrate the material of the light transparent cover 42, and the light-sensing chip 34 can effectively sense the external environment. Further, the transparent portion of the light transparent cover 42 may be coated with a coating in order to filter out a light of a specific wavelength, such as a far infrared ray.

Figure 4:
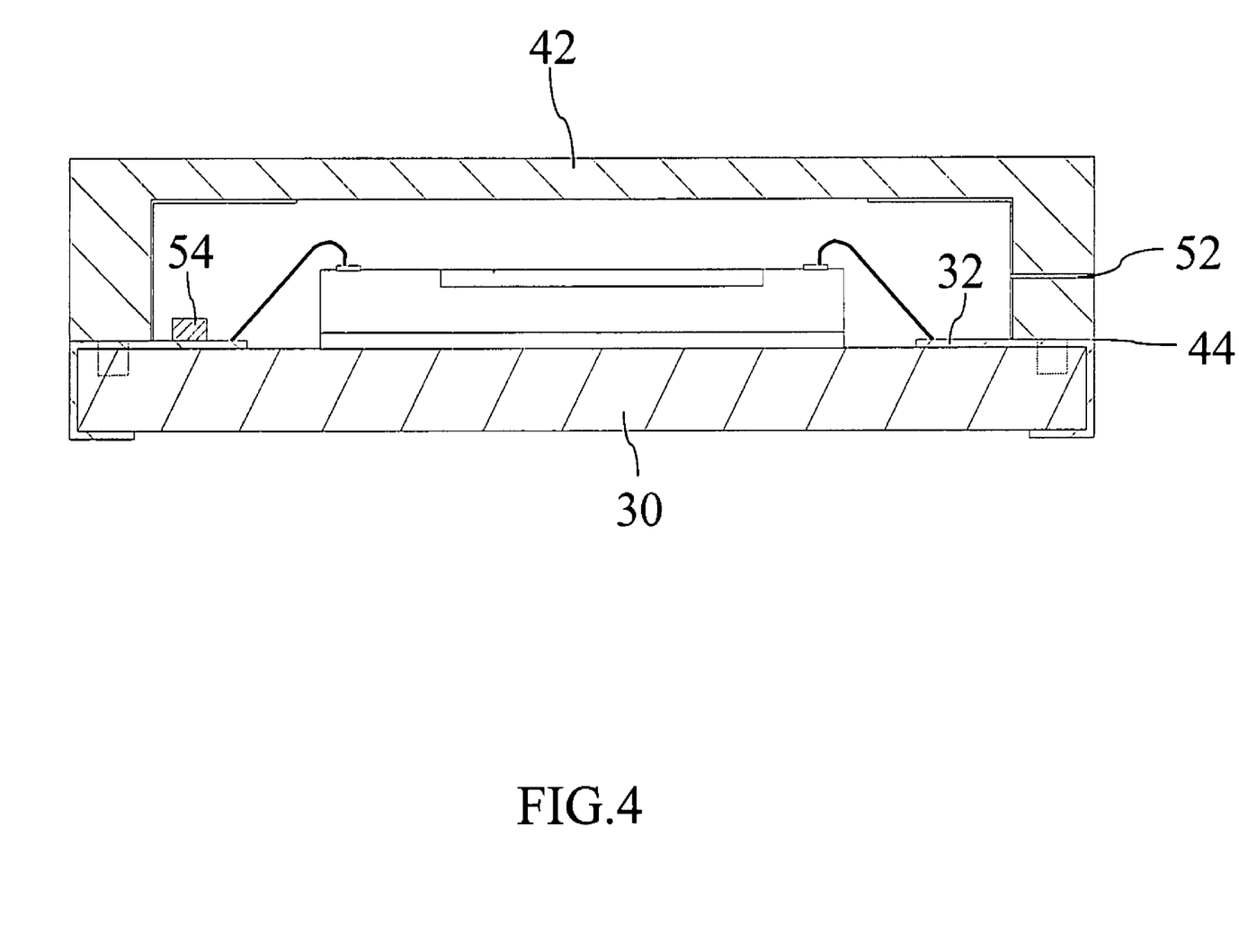
FIG. 4 is a section view showing the packaging structure of a light-sensing element with a via-hole and a passive element according to the present invention.

Furthermore, as shown in FIG. 4, at least one via-hole 52 may be formed on the light transparent cover 42. When the glue material 44 is being hardened for joining the light transparent cover 42 with the substrate 30, the via-holes 52 can balance the gas pressures inside and outside the light transparent cover 42. Then, another glue material is filled into those via-holes 52 and hardened lest external humidity penetrate into the light transparent cover 42. Besides, the substrate 30 may have a passive element 54, and the passive element 54 is electrically connected to the metallization trace 32 of the substrate 30.

Figure 5:
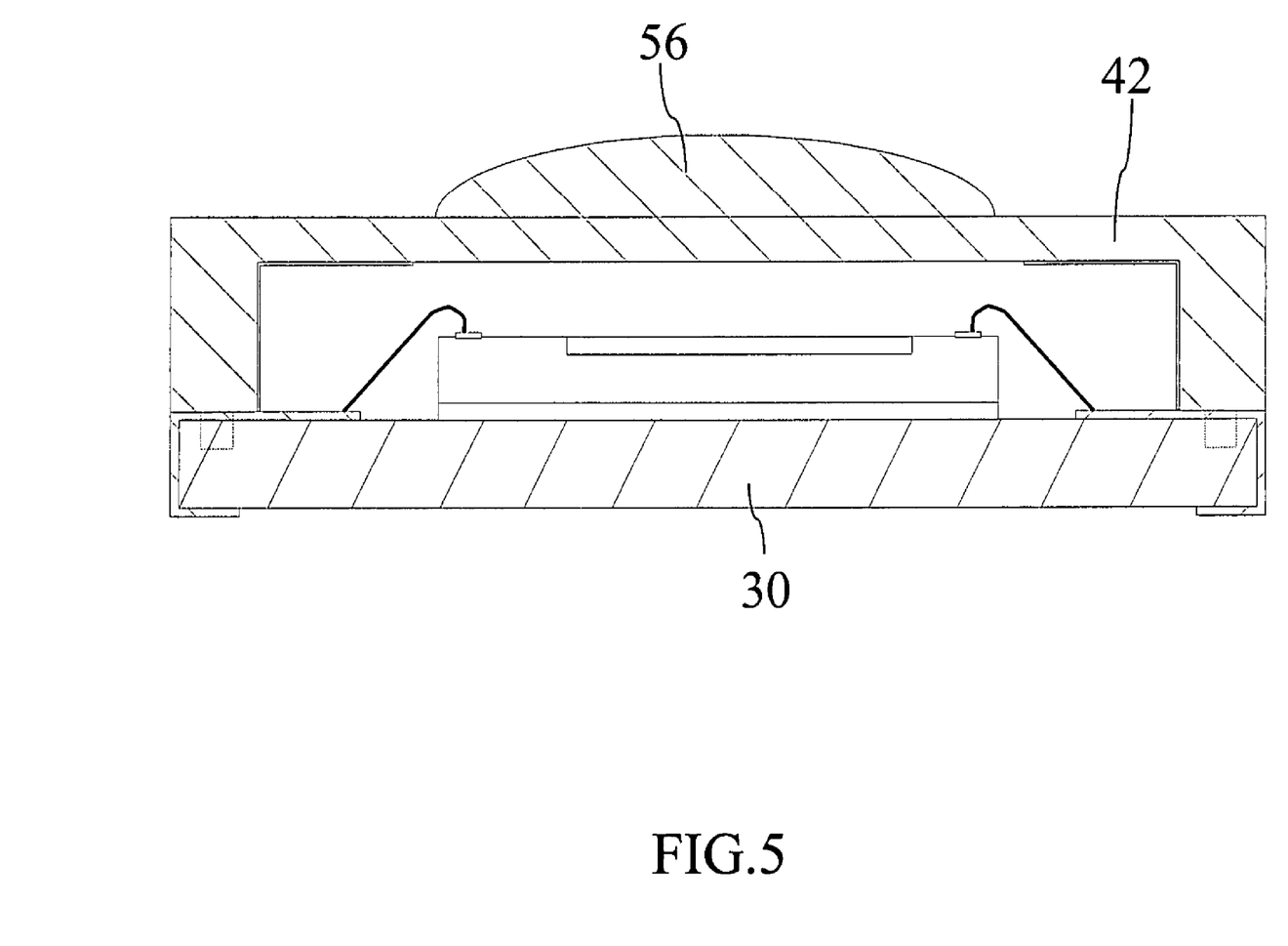
FIG. 5 is a section view showing the packaging structure of a light-sensing element with a lens according to the present invention.

Moreover, as shown in FIG. 5, the transparent portion of the light transparent cover 42 may be formed into a lens 56 in order to obtain a special optical effect.

In summary, the present invention proposes a packaging structure of a light-sensing element and a fabrication method thereof, which not only can decrease pollutants and promote the yield, but also can reduce the packaging area. The present invention can also simplify the fabrication process, reduce the fabrication cost and overcome the problems existing in the conventional technology.

Those embodiments disclosed above are only to clarify the present invention to enable the persons skilled in the art to understand, make and use the present invention; however, those are not intended to limit the scope of the present invention. Any equivalent modification and variation according to the spirit of the present invention disclosed herein is to be included within the scope of the present invention.

What is claimed is:

1. A fabrication method of a packaging structure of a light-sensing element, comprising the following steps:
   providing a substrate, which has at least one metallization trace;
   sticking a light-sensing chip onto said substrate with an adhesive layer;
   electrically connecting said light-sensing chip to said metallization traces with multiple bond wires in a wire-bonding procedure;
   cleaning pollutants on said substrate; and
   installing a light transparent cover having a cavity to said substrate with a glue material, with said light-sensing chip contained inside said cavity and enveloped by said light transparent cover, wherein said light transparent cover has at least one via-hole, said at least one-via hole balancing gas pressures inside and outside said light transparent cover when said glue material is being hardened for joining said light transparent cover with said substrate; after said glue material has been hardened, another glue is filled into said via-holes and hardened lest external humidity penetrate into said light transparent cover.

2. The fabrication method of a packaging structure of a light-sensing element according to claim 1, wherein said adhesive layer is a silver paste or an adhesive tape.

3. The fabrication method of a packaging structure of a light-sensing element according to claim 1, wherein said substrate has at least one first engagement portion, and said light transparent cover has second engagement portions at the positions corresponding to said first engagement portions so that said second engagement portions of said light transparent cover can mate with said first engagement portions of said substrate for alignment.

4. The fabrication method of a packaging structure of a light-sensing element according to claim 3, wherein said first engagement portion is a notch, and said second engagement portion is a protrusion; otherwise, said first engagement portion is a protrusion, and said second engagement portion is a notch; both of said notch and said protrusion can mate with each other for alignment.

5. The fabrication method of a packaging structure of a light-sensing element according to claim 1, wherein said metallization traces comprise at least: a power line, a ground line, a clock signal line, and a data output line; the clock signals of said clock signal line are used in a clock signal interface.

* * * * *